US012765173B2

(12) United States Patent
Shim et al.

(10) Patent No.: US 12,765,173 B2
(45) Date of Patent: Oct. 13, 2026

(54) LIGHT EMITTING DISPLAY APPARATUS

(71) Applicant: LG Display Co., Ltd., Seoul (KR)

(72) Inventors: Seokho Shim, Paju-si (KR); Yuseok Jung, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 618 days.

(21) Appl. No.: 17/978,022

(22) Filed: Oct. 31, 2022

(65) Prior Publication Data

US 2023/0217708 A1 Jul. 6, 2023

(30) Foreign Application Priority Data

Dec. 31, 2021 (KR) ........................ 10-2021-0194750

(51) Int. Cl.
*H01L 27/32* (2006.01)
*H10K 59/121* (2023.01)
*H10K 59/131* (2023.01)

(52) U.S. Cl.
CPC ....... *H10K 59/1213* (2023.02); *H10K 59/131* (2023.02)

(58) Field of Classification Search
CPC ............. H10K 59/1213; H10K 59/131; H10K 59/124; H10K 59/126; H10K 59/123; G09F 9/33; G09F 9/335; H10D 86/411; H10D 86/60; H10D 30/6758; H10D 86/40; H10H 20/852
See application file for complete search history.

(56) References Cited

U.S. PATENT DOCUMENTS

| | | | |
|---|---|---|---|
| 2014/0139772 A1 | 5/2014 | Kim et al. | |
| 2017/0330924 A1 | 11/2017 | Kim et al. | |
| 2020/0152913 A1 | 5/2020 | Noh et al. | |
| 2021/0202910 A1 | 7/2021 | Lee | |
| 2022/0208806 A1 * | 6/2022 | Park | H10D 30/6731 |

FOREIGN PATENT DOCUMENTS

| | | | |
|---|---|---|---|
| CN | 107369691 | A | 11/2017 |
| CN | 111244131 | A | 6/2020 |
| CN | 113130658 | A | 7/2021 |
| KR | 10-2020-0082752 | A | 7/2020 |
| KR | 20200078175 | A | 7/2020 |

* cited by examiner

*Primary Examiner* — Elmito Breval
(74) *Attorney, Agent, or Firm* — Seed Intellectual Property Law Group LLP

(57) ABSTRACT

A light emitting display apparatus includes a base substrate, a buffer provided in the base substrate, a pixel driving circuit layer provided on the buffer, the pixel driving circuit layer including transistors, a first planarization layer surrounding the pixel driving circuit layer, a hydrogen collection layer surrounding the first planarization layer, a second planarization layer covering the hydrogen collection layer, a light emitting device provided on the second planarization layer and connected to a driving transistor of the transistors, and an encapsulation layer covering the light emitting device.

20 Claims, 9 Drawing Sheets

LIGHT EMITTING DISPLAY APPARATUS

CROSS-REFERENCE TO RELATED APPLICATIONS

This application claims the benefit of the Korean Patent Application No. 10-2021-0194750 filed on Dec. 31, 2021, which is hereby incorporated by reference as if fully set forth herein.

BACKGROUND

Technical Field

The present disclosure relates to a light emitting display apparatus.

Description of the Related Art

Each of pixels of light emitting display apparatuses may include a light emitting device, the light emitting device may be driven by transistors included in a pixel driving circuit, and the transistors may include an oxide semiconductor.

BRIEF SUMMARY

The inventors recognize that when a light emitting display apparatus is maintained or driven for a long time at a high temperature environment, threshold voltages of the transistors may be changed by hydrogen diffused from an encapsulation layer covering the light emitting device. Due to this, a defect where smears are displayed may occur in light emitting display apparatuses.

The present disclosure provides a light emitting display apparatus that substantially obviates one or more problems due to limitations and disadvantages of the related art.

An aspect of the present disclosure provides a light emitting display apparatus in which each of pixels includes a hydrogen collection layer for collecting hydrogen and transistors are surrounded and sealed by the hydrogen collection layer.

Additional advantages and features of the disclosure will be set forth in part in the description which follows and in part will become apparent to those having ordinary skill in the art upon examination of the following or may be learned from practice of the disclosure. The technical benefits and other advantages of the disclosure may be realized and attained by the structure for example pointed out in the written description including the claims as well as the appended drawings.

The disclosure, as embodied and broadly described herein, provides a light emitting display apparatus including a base substrate, a buffer provided in the base substrate, a pixel driving circuit layer provided on the buffer, the pixel driving circuit layer including transistors, a first planarization layer surrounding the pixel driving circuit layer, a hydrogen collection layer surrounding the first planarization layer, a second planarization layer covering the hydrogen collection layer, a light emitting device provided on the second planarization layer and connected to a driving transistor of the transistors, and an encapsulation layer covering the light emitting device.

It is to be understood that both the foregoing general description and the following detailed description of the present disclosure are example and explanatory and are intended to provide further explanation of the disclosure.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION

Figure 1:
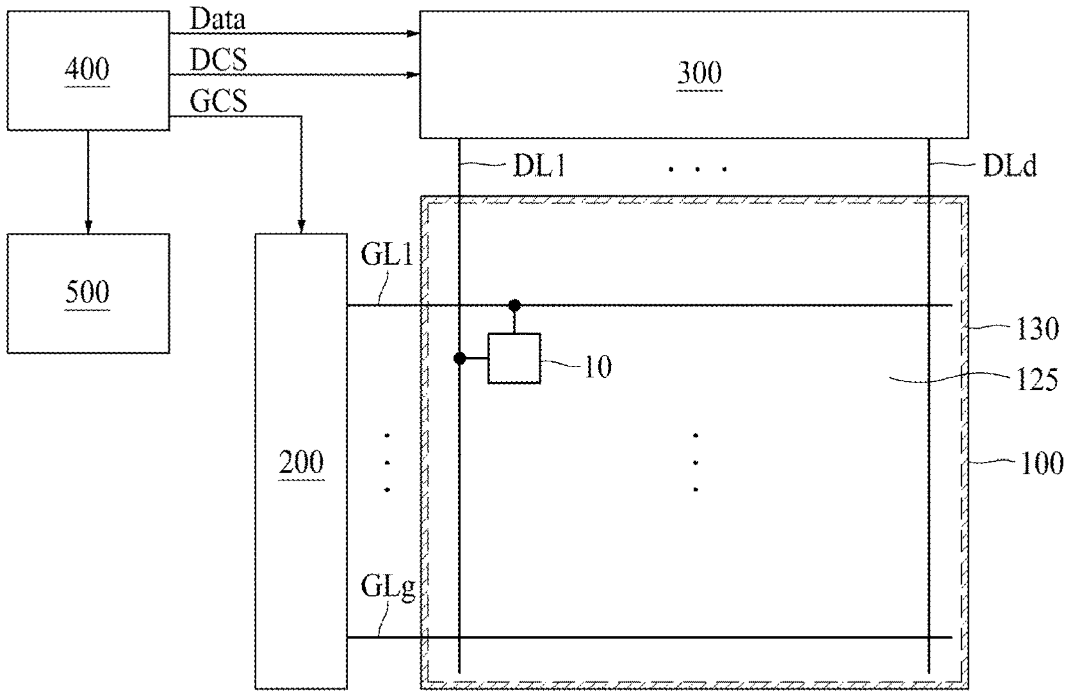
FIG. 1 is an example diagram illustrating a configuration of a light emitting display apparatus according to the present disclosure.

Reference will now be made in detail to the example embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the description herein, when the detailed description of the relevant known function or configuration is determined to unnecessarily obscure the important point of the present disclosure, the detailed description will be omitted. When “comprise,” “have,” and “include” described in the present specification are used, another part may be added unless “only” is used. The terms of a singular form may include plural forms unless referred to the contrary.

In construing an element, the element is construed as including an error or tolerance range although there is no explicit description of such an error or tolerance range.

In describing a position relationship, for example, when a position relation between two parts is described as, for example, "on," "over," "under," and "next," one or more other parts may be disposed between the two parts unless a more limiting term, such as "just" or "direct(ly)" is used.

In describing a time relationship, for example, when the temporal order is described as, for example, "after," "subsequent," "next," and "before," a case that is not continuous may be included unless a more limiting term, such as "just," "immediate(ly)," or "direct(ly)" is used.

It will be understood that, although the terms "first," "second," etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms "first," "second," "A," "B," "(a)," "(b)," etc., may be used. These terms are intended to identify the corresponding elements from the other elements, and basis, order, or number of the corresponding elements should not be limited by these terms. When expression that an element or layer is "connected," "coupled," or "adhered" to another element or layer, the element or layer can not only be directly connected or adhered to another element or layer, but also be indirectly connected or adhered to another element or layer with one or more intervening elements or layers "disposed," or "interposed" between the elements or layers, unless otherwise specified.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, embodiments of the present disclosure will be described in detail with reference to the accompanying drawings.

Figure 2:
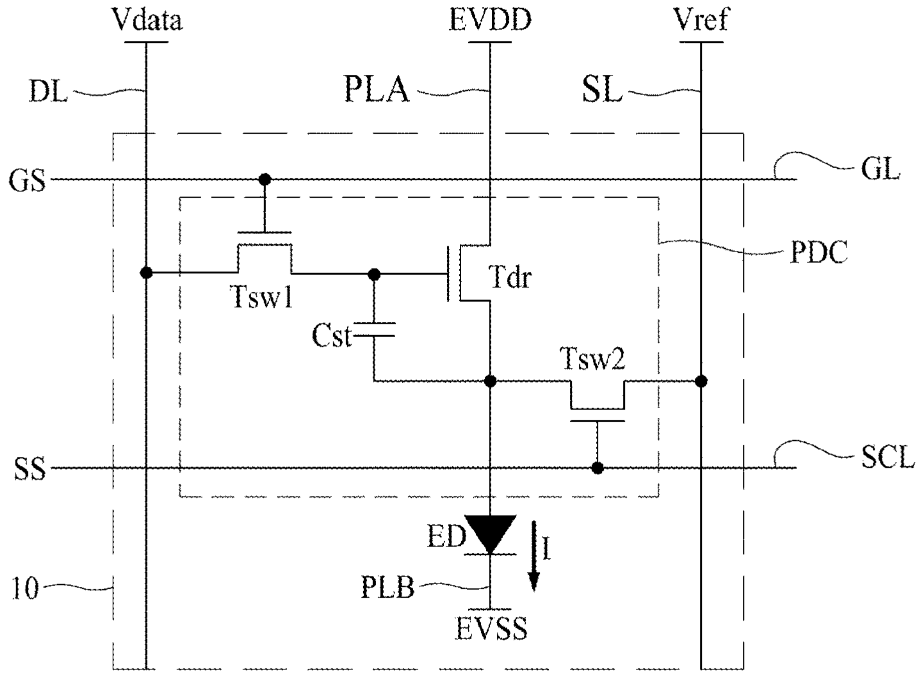
FIG. 2 is an example diagram illustrating a structure of a pixel applied to a light emitting display apparatus according to the present disclosure.

FIG. 1 is an example diagram illustrating a configuration of a light emitting display apparatus according to the present disclosure, and FIG. 2 is an example diagram illustrating a structure of a pixel applied to a light emitting display apparatus according to the present disclosure.

The light emitting display apparatus according to the present disclosure may configure various electronic devices. The electronic devices may include, for example, smartphones, tablet personal computers (PCs), televisions (TVs), and monitors.

The light emitting display apparatus according to the present disclosure, as illustrated in FIG. 1, may include a light emitting display panel 100 which includes a display area 125 displaying an image and a non-display area 130 provided outside the display area 125, a gate driver 200 which supplies a gate signal to a plurality of gate lines GL1 to GLg provided in the light emitting display panel 100, a data driver 300 which supplies data voltages to a plurality of data lines DL1 to DLd provided in the light emitting display panel 100, a controller 400 which controls driving of the gate driver 200 and the data driver 300, and a power supply 500 which supplies power to the controller, the gate driver, the data driver, and the light emitting display panel. For example, in the light emitting display apparatus according to the present disclosure, stages included in the gate driver 200 may be provided in the display area 125, and the gate lines GL1 to GLg connected to the stages may be provided in the light emitting display panel 100.

First, the light emitting display panel 100 may include the display area 125 and the non-display area 130.

A plurality of pixels 10 displaying an image may be provided in the display area 125, and the non-display area 130 may be adjacent to or surround the display area 125.

As described herein, because the gate driver 200 connected to gate lines are provided in the display area 125, a non-display area for the gate driver 200 may be omitted. Accordingly, a width of the non-display area 130 may be reduced compared to the related art.

The gate lines GL1 to GLg, the data lines DL1 to DLd, and the pixels 10 may be provided in the display area 125. Also, stages configuring the gate driver 200 may be provided in the display area 125. Accordingly, the display area 125 may display an image. Here, g and d may each be a natural number.

However, in the present disclosure, the gate driver 200 may not be provided in the display area.

The pixel 10 included in the light emitting display panel 100, as illustrated in FIG. 2, may include an emission area which includes a pixel driving circuit PDC, including a switching transistor Tsw1, a storage capacitor Cst, a driving transistor Tdr, and a sensing transistor Tsw2, and a light emitting device ED.

A structure of the pixel 10 included in the light emitting display panel 100 is not limited to a structure illustrated in FIG. 2. Accordingly, a structure of the pixel 10 may be changed to various shapes.

Various insulation layers and electrodes configuring the pixels 109 may be provided on a first base substrate such as a glass substrate or a film. That is, the light emitting display panel 100 may include a first base substrate, a plurality of insulation layers provided on the first base substrate, and a plurality of electrodes provided on the first base substrate.

The data driver 300 may supply data voltages to the data lines.

The controller 400 may realign input video data transferred from an external system by using a timing synchronization signal transferred from the external system and may generate a data control signal DCS which is to be supplied to the data driver 300 and a gate control signal GCS which is to be supplied to the gate driver 200.

In some embodiments, the controller 400 may include a data aligner which realigns input video data to generate image data Data and supplies the image data Data to the data driver 300, a control signal generator which generates the gate control signal GCS and the data control signal DCS by using the timing synchronization signal, an input unit which receives the timing synchronization signal and the input video data transferred from the external system and respectively transfers the timing synchronization signal and the input video data to the control signal generator and the data aligner, and an output unit which supplies the data driver 300 with the image data Data generated by the data aligner and the data control signal DCS generated by the control signal generator and supplies the gate driver 200 with the gate control signal GCS generated by the control signal generator.

The external system may perform a function of driving the controller 400 and an electronic device. For example, when the electronic device is a TV, the external system may receive various sound information, video information, and letter information over a communication network and may transfer the received video information to the controller 400. In some embodiments, the image information may include input video information.

The power supply 500 may generate various powers and may supply the generated powers to the controller 400, the gate driver 200, the data driver 300, and the light emitting display panel 100.

The gate driver 200 may supply gate pulses to the gate lines GL1 to GLg. When the gate pulse generated by the gate driver 200 is supplied to the gate of the switching transistor Tsw1 included in the pixel 10, the switching transistor Tsw1 may be turned on. When the switching transistor Tsw1 is turned on, a data voltage supplied through a data line may be supplied to the pixel 10. When a gate-off signal generated by the gate driver 200 is supplied to the gate of the switching transistor Tsw1, the switching transistor Tsw1 may be turned off. When the switching transistor Tsw1 is turned off, a data voltage may not be supplied to the pixel 10 any longer. The gate signal GS supplied to the gate line GL may include the gate pulse and the gate-off signal.

The gate driver 200 may include a plurality of stages, and the stages may be connected to the gate lines GL1 to GLg.

The stages may be included in the light emitting display panel 100, and in some embodiments, may be provided in the display area 125.

Figure 3:
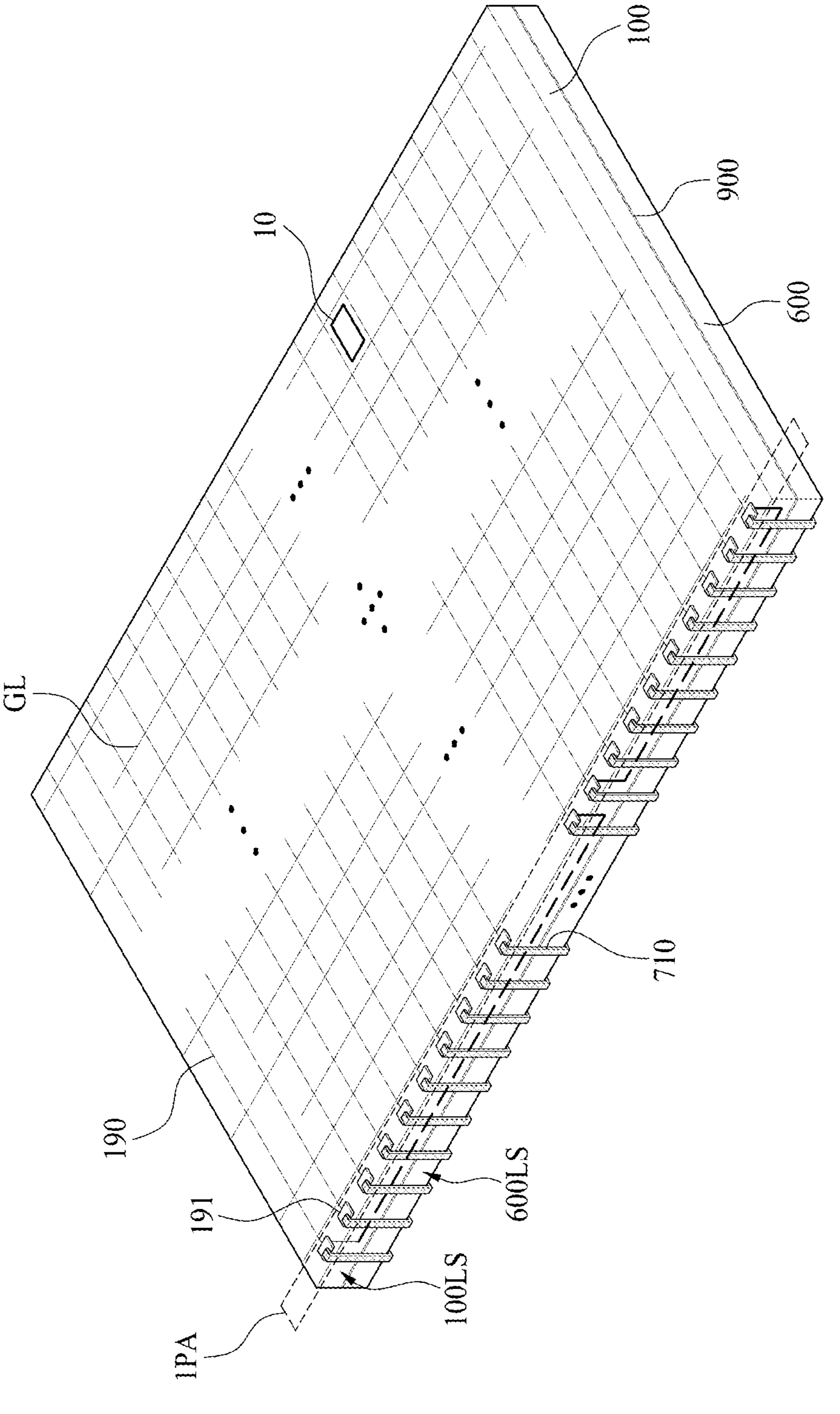
FIG. 3 is a perspective view illustrating a front surface of a light emitting display apparatus according to the present disclosure.
Figure 4:
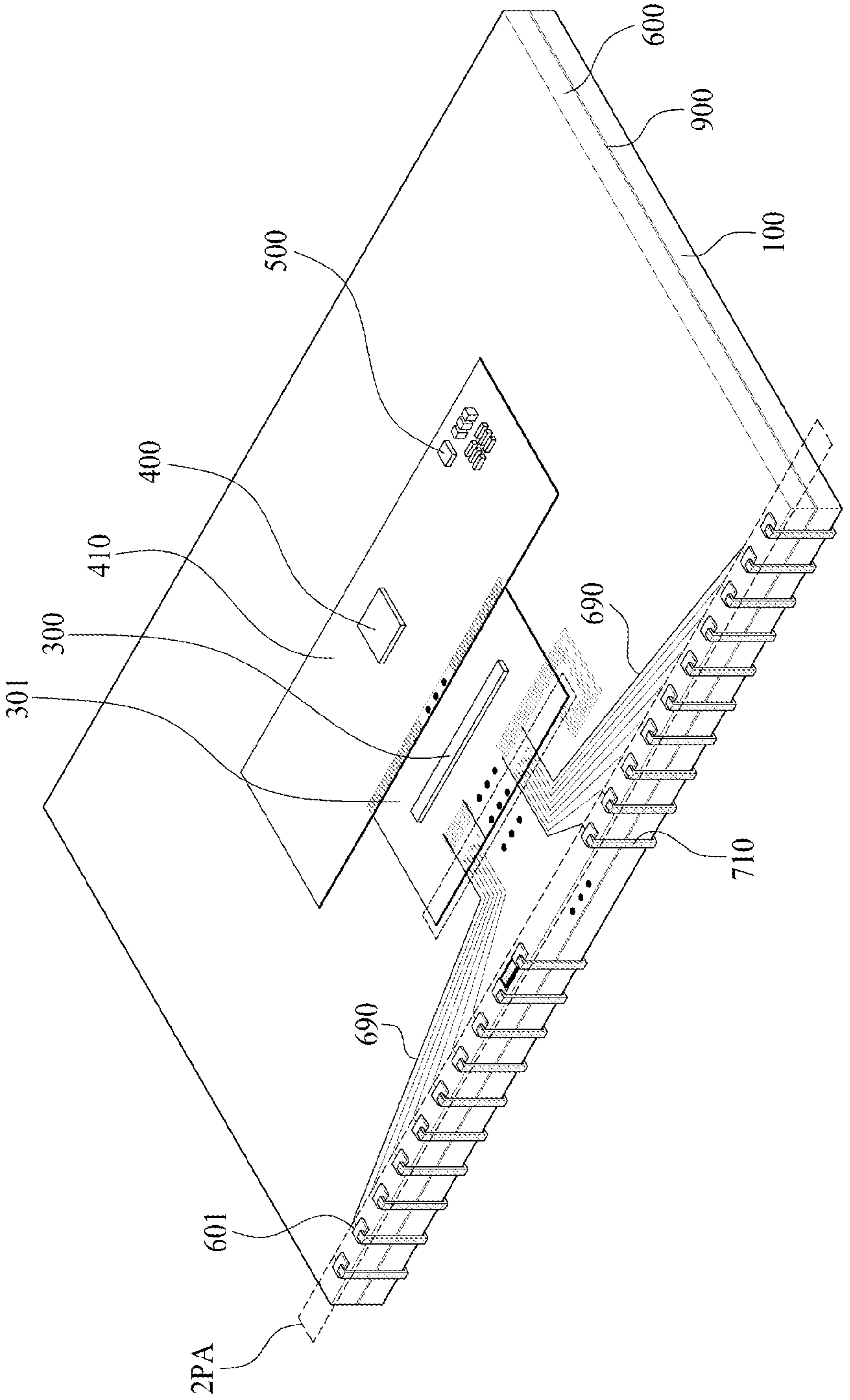
FIG. 4 is a perspective view illustrating a rear surface of a light emitting display apparatus according to the present disclosure.

FIG. 3 is a perspective view illustrating a front surface of a light emitting display apparatus according to the present disclosure, and FIG. 4 is a perspective view illustrating a rear surface of a light emitting display apparatus according to the present disclosure.

The light emitting display apparatus according to the present disclosure may include a first substrate 100, including pixels 10 and signal lines 190 arranged in a first direction, and a second substrate 600 which is disposed on a rear surface of the first substrate 100. The first substrate 100 may be bonded to the second substrate 600 by a coupling member 900.

The first substrate 100 may be the light emitting display panel 100 described herein with reference to FIGS. 1 and 2. In the description herein, therefore, reference numeral "100" assigned to the light emitting display panel may be used as a reference numeral of the first substrate.

The signal lines 190 included in the first substrate 100 may include data lines DL1 to DLd which transfer data voltages to the pixels 10, power lines which transfer driving voltages to the pixels 10, gate clock lines which transfer gate clocks to a gate driver 200, and gate power lines which transfer gate driving voltages to the gate driver 200. The power lines may include a high voltage supply line PLA and a low voltage supply line PLB illustrated in FIG. 2. The signal lines 190 may include a sensing line SL illustrated in FIG. 2

In the first substrate 100, a first pad portion 1PA provided in a first lateral direction of the first substrate 100 may include first pads 191 which are connected to the signal lines 190 and the routing lines 710.

As illustrated in FIG. 4, in the second substrate 600, a second pad portion 2PA provided in a first lateral direction of the second substrate 600 may include second pads 601 which are connected to the routing lines 710.

The routing lines 710 may be provided at a first lateral surface 100LS of the first substrate 100 and a first lateral surface 600LS of the second substrate 600. That is, the routing lines 710 provided at the first lateral surface 100LS of the first substrate 100 and the first lateral surface 600LS of the second substrate 600 may extend to the first pad portion 1PA and may be connected to the first pads 191 included in the first pad portion 1PA.

Moreover, the routing lines 710 provided at the first lateral surface 100LS of the first substrate 100 and the first lateral surface 600LS of the second substrate 600 may extend to the second pad portion 2PA and may be connected to the second pads 601 included in the second pad portion 2PA.

As illustrated in FIG. 4, link lines 690 connected to the routing lines 710 and the second pads 601 may be provided in the second substrate 600. The link lines 690 may be connected to at least one driver. Some of the link lines 690 may be connected to a data driver 300 (e.g., through a printed circuit board (PCB) 301), some of the link lines 690 may be connected to a controller 400, and some of the link lines 690 may be connected to a power supply 500. For example, in FIG. 4, as an example of the present disclosure, a light emitting display apparatus is illustrated where the link lines 690 are connected to the data driver 300 through a first printed circuit board (PCB) 301 with the data driver mounted thereon and the first PCB 301 is connected to a second PCB 410 with the controller 400 mounted thereon. In this case, the power supply 500 may be mounted on the second PCB 410.

Figure 5:
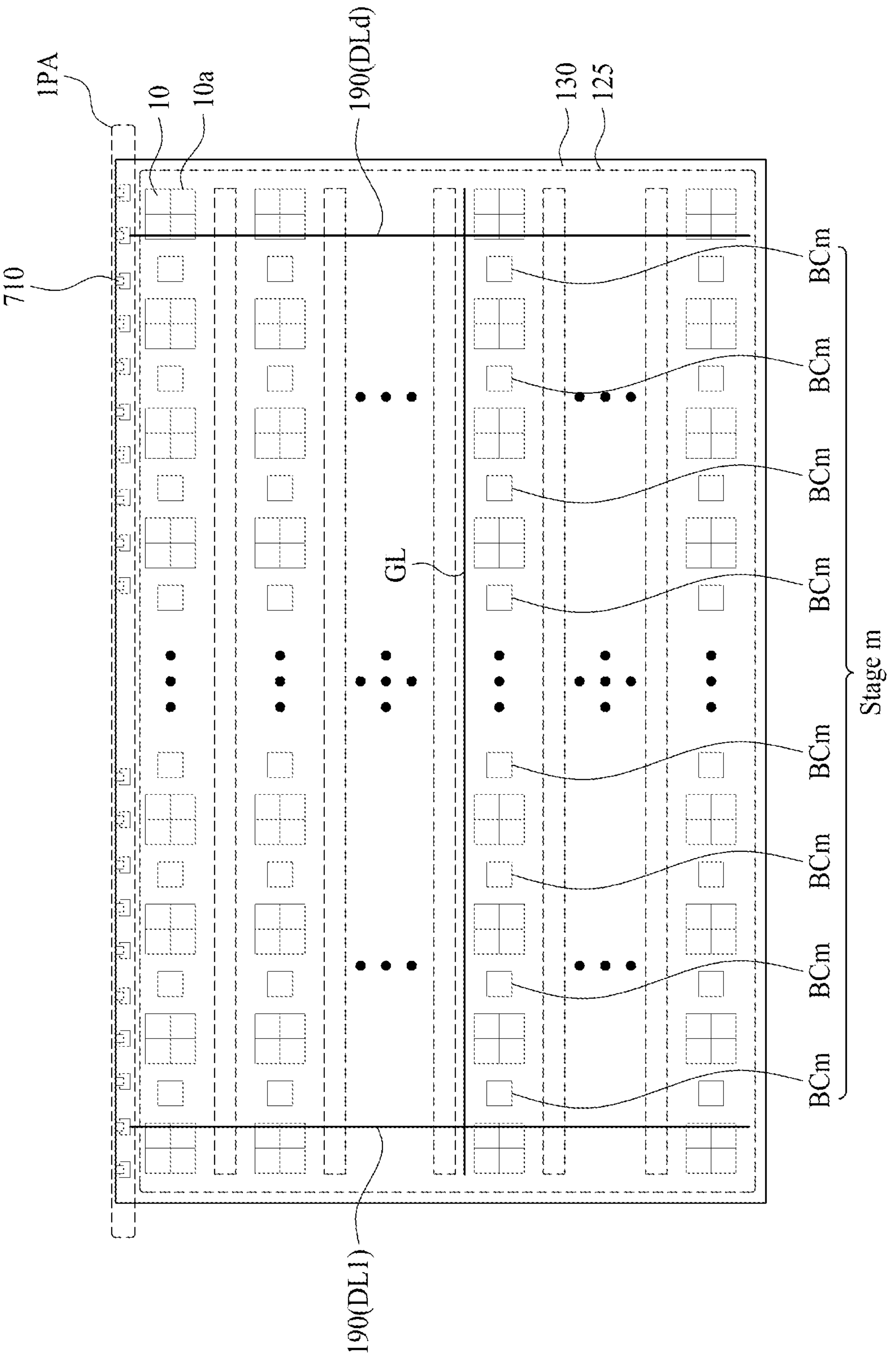
FIG. 5 is an example diagram illustrating a front surface of a light emitting display apparatus according to the present disclosure.

FIG. 5 is an example diagram illustrating a front surface of a light emitting display apparatus according to the present disclosure.

As described herein, the light emitting display apparatus according to the present disclosure may include a first substrate 100, including pixels 10 and signal lines 190 arranged in a first direction, and a second substrate 600 which is disposed on a rear surface of the first substrate 100.

The signal lines 190 and the pixels 10 may be included in the first substrate 100. The signal lines 190 may include data lines DL1 to DLd which transfer data voltages to the pixels 10, power lines which transfer driving voltages to the pixels 10, gate clock lines which transfer gate clocks to a gate driver 200, and gate power lines which transfer gate driving voltages to the gate driver 200. Hereinafter, for convenience of description, as an example of the present disclosure, a light emitting display apparatus where the signal lines 190 are data lines will be described.

That is, as illustrated in FIGS. 3 and 5, the pixels 10 may be provided in the first substrate 100, and the data lines DL connected to the routing lines 710 through first pads 191 may be provided in the first substrate 100. The first pads 191 may be included in a first pad portion 1PA.

A gate driver 200 may include stages, for sequentially outputting gate pulses. Each of the stages may include a plurality of stage transistors. In some embodiments, the stage transistors may be provided in a display area 125 of the first substrate 100.

For example, as illustrated in FIG. 5, an $m^{th}$ stage Stage m of the gate driver 200 may include a plurality of $m^{th}$ branch circuit units BCm, and each of the $m^{th}$ branch circuit units BCm may include at least one stage transistor included in the $m^{th}$ stage Stage m.

The $m^{th}$ branch circuit units BCm, as illustrated in FIG. 5, may be provided between unit pixels 10*a* configured with four pixels 10. For example, the unit pixel 10*a* may include a white pixel W, a red pixel R, a green pixel G, and a blue pixel B.

That is, in the light emitting display apparatus according to the present disclosure, the gate driver 200 may be provided in the display area 125 of the first substrate 100, and various lines described herein may be the signal lines 190.

In some embodiments, the signal lines 190 may be connected to routing lines 710 through the first pads 191 included in the first pad portion 1PA of the first substrate 100.

The first pads 191 may be connected to second pads 601 included in a second pad portion 2PA of the second substrate 600 through the routing lines 710 provided at the first lateral surface 100LS of the first substrate 100 and the first lateral surface 600LS of the second substrate 600.

The link lines 690 connected to the second pads 601 may be connected to the data driver 300, the controller 400, and the power supply 500, which are provided on a rear surface of the second substrate 600.

The light emitting display apparatus according to the present disclosure, as illustrated in FIG. 1, may include the light emitting display panel 100, the gate driver 200, the data driver 300, the controller 400, and the power supply 500.

Moreover, as described herein with reference to FIGS. 3 to 5, the light emitting display apparatus according to the present disclosure may include the first substrate 100 corresponding to the light emitting display panel illustrated in FIG. 1, the second substrate 600 attached on a rear surface of the first substrate 100, the data driver 300, the controller 400, and the power supply 500. In some embodiments, the gate driver 200 may be provided in the display area 125 of the first substrate 100.

That is, as illustrated in FIG. 1, the light emitting display apparatus according to the present disclosure may include the light emitting display panel 100 and the gate driver 200 provided in the non-display area 130 of the light emitting display panel 100, and as illustrated in FIGS. 3 to 5, may include the first substrate 100, the second substrate 600, and the gate driver provided in the display area of the first substrate 100, corresponding to the light emitting display panel.

Features of the present disclosure may be based on the light emitting display panel 100 illustrated in FIG. 1 and/or the first substrate 100 illustrated in FIG. 3. Hereinafter, therefore, the present disclosure will be described with reference to the light emitting display panel 100 among a first substrate and a light emitting display panel referred to by like reference numeral. That is, the light emitting display panel 100 described herein may be applied to the light emitting display apparatus illustrated in FIG. 1, and moreover, may be applied to the light emitting display apparatus illustrated in FIGS. 3 to 5.

Figure 6:
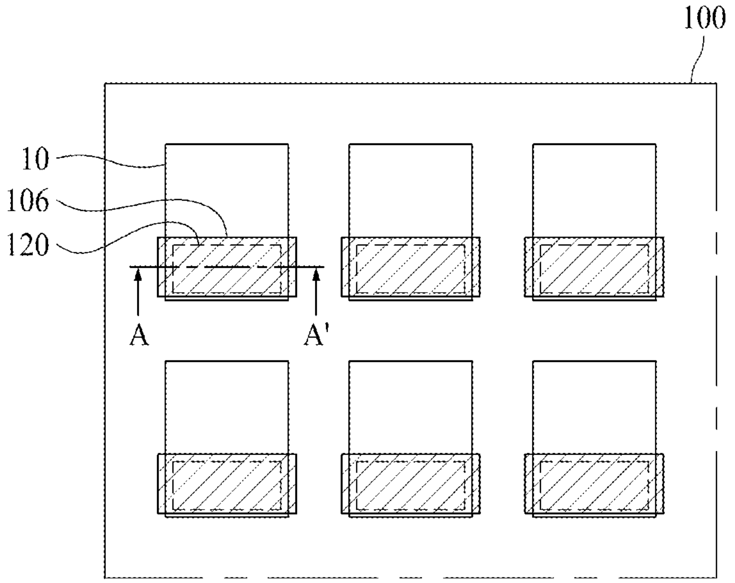
FIGS. 6 and 7 are example diagrams illustrating a portion of a flat surface of a light emitting display panel according to the present disclosure.
Figure 7:
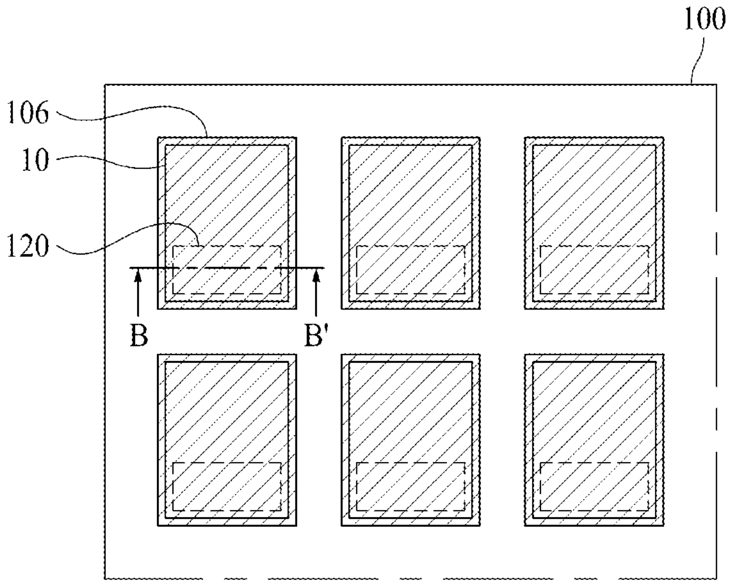
Figure 8:
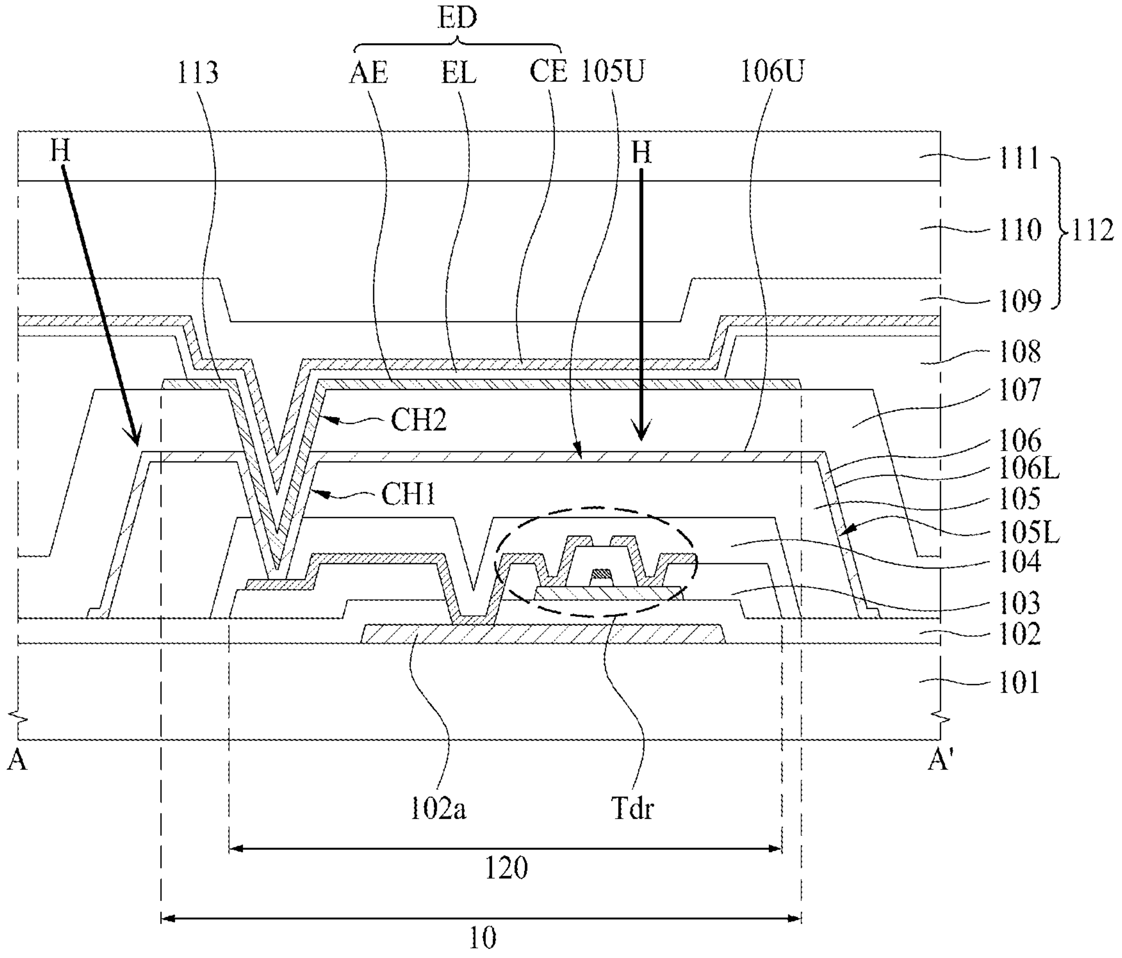
FIG. 8 is an example diagram illustrating a cross-sectional surface taken along line A-A' illustrated in FIGS. 6 and 7.

FIGS. 6 and 7 are example diagrams illustrating a portion of a flat surface of a light emitting display panel according to the present disclosure, and FIG. 8 is an example diagram illustrating a cross-sectional surface taken along line A-A' illustrated in FIGS. 6 and 7. That is, some of pixels 10 included in a light emitting display panel 100 are illustrated in FIGS. 6 and 7. In the description herein, details which are the same or similar to details described herein with reference to FIGS. 1 to 5 are omitted or will be briefly described.

A transistor applied to a light emitting display apparatus may be formed of amorphous silicon, formed of polysilicon, or formed of an oxide semiconductor.

When a transistor including an oxide semiconductor, hereinafter simply referred to as an oxide transistor, e.g., thin-film transistors based on transparent amorphous oxide semiconductors (TAOS-TFT), is used for a long time at a high temperature environment, a threshold voltage of the oxide transistor may be shifted in a negative direction by hydrogen diffused from an encapsulation layer covering a light emitting device, and due to this, smears may occur.

For example, in a light emitting display apparatus having a structure described herein with reference to FIGS. 3 to 5, an oxide transistor may be used, and a thin film encapsulation (TFE) layer may be used. In some embodiments, when the light emitting display apparatus is used for a long time at a high temperature environment, smears may occur in an image displayed by the light emitting display apparatus due to the shift of a threshold voltage described herein. For example, smears may occur due to the shift of a threshold voltage of a driving transistor connected to a light emitting device ED.

In the present disclosure, a hydrogen collection layer formed of metal may be patterned in a three-dimensional (3D) shape on an oxide transistor. That is, the oxide transistor may be surrounded and sealed by the hydrogen collection layer.

According to the present disclosure, because hydrogen diffused from an encapsulation layer provided on a light emitting device is collected or blocked by the hydrogen collection layer, hydrogen diffused from the encapsulation layer may not flow into transistors.

Therefore, according to the present disclosure, an error may not occur where the threshold voltage of the oxide transistor is shifted by hydrogen, and thus, the quality of the light emitting display apparatus may be maintained for a long time.

In some embodiments, the shift of threshold voltages of transistors caused by hydrogen may occur in a light emitting display apparatus including various transistors, in addition to the light emitting display apparatus including an oxide semiconductor described herein. Accordingly, the present disclosure may be applied to a light emitting display apparatus including various transistors, in addition to the light emitting display apparatus including an oxide semiconductor.

The light emitting display apparatus according to the present disclosure, as illustrated in FIG. 8 and described herein, may include a base substrate 101, a buffer (e.g., buffer layer) 102 provided in the base substrate 101, a pixel driving circuit layer 120 which is disposed on the buffer 102 and includes transistors, a first planarization layer 105 on, and in some embodiments, surrounding the pixel driving circuit layer 120, a hydrogen collection layer 106 on and, and in some embodiments, surrounding the first planarization layer 105, a second planarization layer 107 which covers the hydrogen collection layer 106, a light emitting device ED which is provided on the second planarization layer 107 and is connected to a driving transistor Tdr of transistors, and an encapsulation layer 112 which covers the light emitting device ED.

The terms surround and surrounding are used herein in there broadest meaning of being adjacent to and around at least one or more sides and is not limited to fully surrounding all sides, including the top and bottom, unless expressly stated as to how many sides are surrounded. Thus, it includes being around two sides, four sides, laterally, just two dimensions or all three dimensions, again, unless expressly stated differently.

The base substrate 101 may include a glass substrate, a plastic substrate, or a film.

The buffer 102 may be disposed on the base substrate 101. The buffer 102 may include at least one inorganic layer, at least one organic layer, or a combination layer of at least one inorganic layer and at least one organic layer. The buffer 102 may be omitted A light blocking metal 102*a* may be provided between the base substrate 101 and the buffer 102. The light blocking metal 102*a* may be used as a signal line 190, used for preventing light from flowing into a semiconductor layer of a transistor from the outside, or used for supplying a signal to a transistor. In FIG. 8, the light blocking metal 102*a* connected to the driving transistor Tdr is illustrated.

The pixel driving circuit layer 120 may be disposed on the buffer 102.

The pixel driving circuit layer 120 may include transistors Tsw1, Tsw2, and Tdr and a storage capacitor Cst, which are included in a pixel driving circuit PDC described herein with reference to FIG. 2. That is, in FIG. 8, only the driving transistor Tdr connected to an anode electrode AE among transistors included in the pixel driving circuit layer 120 is illustrated, but the pixel driving circuit layer 120 may include all transistors included in the pixel driving circuit PDC.

In some embodiments, the transistors including the driving transistor Tdr may be formed of an oxide semiconductor as described herein, or may be formed of various other semiconductors such as amorphous silicon or polysilicon. Also, each of the transistors included in the pixel driving circuit layer 120 may be formed of at least one of various semiconductors such as an oxide semiconductor, amorphous silicon, and polysilicon.

The transistor included in the pixel driving circuit layer 120 may include a first insulation layer 103 and may be covered by a second insulation layer 104.

For example, as illustrated in FIG. 8, the driving transistor Tdr included in the pixel driving circuit layer 120 may include the first insulation layer 103, and the driving transistor Tdr may be covered by the second insulation layer 104. That is, the second insulation layer 104 may be provided on the transistors included in the pixel driving circuit layer 120 and may protect the transistors.

Each of the first insulation layer 103 and the second insulation layer 104 may include at least one inorganic layer, at least one organic layer, or a combination layer of at least one inorganic layer and at least one organic layer.

The first planarization layer 105 may cover or surround the pixel driving circuit layer 120. For example, the first planarization layer 105 may seal the pixel driving circuit layer 120 along with the buffer 102. In some embodiments, as shown in the description herein, the pixel driving circuit layer 120 is sealed by the first planarization layer 105 and the buffer 102. For example, an upper surface, a lower surface, and lateral surfaces of the pixel driving circuit layer 120 are surrounded by the first planarization layer 105 and the buffer 102.

The first planarization layer 105 may planarize the upper surface of the pixel driving circuit layer 120, and thus, may be formed to be thick by using an organic layer. However, the first planarization layer 105 may include at least one inorganic layer, at least one organic layer, or a combination layer of at least one inorganic layer and at least one organic layer.

The hydrogen collection layer 106 may cover or surround the first planarization layer 105. For example, the hydrogen collection layer 106 may seal the first planarization layer 105, along with the buffer 102. In some embodiments, as shown in the description herein, the first planarization layer 105 is sealed by the hydrogen collection layer 106 and the buffer 102. For example, an upper surface, a lower surface, and lateral surfaces of the first planarization layer 105 are surrounded by the hydrogen collection layer 106 and the buffer 102.

The hydrogen collection layer 106 may include metal for easily collecting hydrogen, and for example, may include titanium (Ti) or an alloy of molybdenum and titanium (MoTi).

The second planarization layer 107 may cover or surround the hydrogen collection layer 106. The second planarization layer 107 may be formed to be thick by using an organic layer and may include at least one inorganic layer, at least one organic layer, or a combination layer of at least one inorganic layer and at least one organic layer.

For example, the second planarization layer 107 may be continuously provided in all pixels 10 included in the base substrate 101.

The first planarization layer 105 and the hydrogen collection layer 106 may be arranged in an island shape in each of the pixels 10, and the island shapes of the first planarization layer 105 and the hydrogen collection layer 106 in the pixels 10 may be spaced apart from each other among the pixels 10. In some embodiments, the second planarization layer 107 may be continuously arranged in adjacent pixels 10.

The light emitting device ED may be disposed on the second planarization layer 107. The light emitting device ED may include an anode electrode AE provided on the second planarization layer 107, a light emitting layer EL provided on the anode electrode AE, and a cathode electrode CE provided on the light emitting layer EL.

A bank 108 may be provided between adjacent light emitting devices ED. That is, pixels may be divided by the bank 108, and an opening region where light is output from the anode electrode AE may be formed.

Finally, an upper end of the light emitting device ED may be covered by the encapsulation layer 112.

In some embodiments, the encapsulation layer 112 may be formed of a single layer, formed of two layers, formed of three layers as illustrated in FIG. 8, or formed of at least four layers.

In a case where the encapsulation layer 112 is formed of three layers as illustrated in FIG. 8, the encapsulation layer 112 may include a first passivation layer 109 covering a cathode electrode CE, a particle prevention layer (PCL) 110 covering the first passivation layer 109, and a second passivation layer 111 covering the particle prevention layer 110.

The first passivation layer 109 may protect the cathode electrode CE, the particle prevention layer 110 may prevent the penetration of water or air from the outside, and the second passivation layer 111 may protect the particle prevention layer 110.

In some embodiments, as illustrated in FIG. 8, hydrogen (H) diffused to the pixel driving circuit layer 120 may occur in the second passivation layer 111, or may occur in the particle prevention layer 110 and the first passivation layer 109. For example, hydrogen (H) occurring in the second passivation layer 111 may pass through the particle prevention layer 110, the first passivation layer 109, the cathode electrode CE, and the second planarization layer 107 and may be diffused to the pixel driving circuit layer 120.

However, according to the present disclosure, hydrogen diffused from the encapsulation layer 112 may be collected or blocked by the hydrogen collection layer 106 surrounding the pixel driving circuit layer 120, and thus, may not flow into the pixel driving circuit layer 120.

Hereinafter, a structure and a feature of the present disclosure for preventing hydrogen diffused from the encapsulation layer 112 from flowing into the pixel driving circuit layer 120 will be described.

First, as described herein, the first planarization layer 105 may surround the pixel driving circuit layer, and the hydrogen collection layer 106 may surround the first planarization layer 105.

Here, that the first planarization layer 105 surrounds the pixel driving circuit layer 120 may denote that the first planarization layer 105 covers an upper surface and lateral surfaces of the pixel driving circuit layer 120.

Moreover, that the hydrogen collection layer 106 surrounds the first planarization layer 105 may denote that the hydrogen collection layer 106 covers an upper surface and lateral surfaces of the first planarization layer 105.

In some embodiments, the pixel driving circuit layer 120 may be surrounded and/or sealed by the buffer 102 and the first planarization layer 105. That is, as described herein, an upper surface, a lower surface, and lateral surfaces of the pixel driving circuit layer 120 may be surrounded by the first planarization layer 105 and the buffer 102.

To provide an additional description, as illustrated in FIG. 8, the first planarization layer 105 may cover the upper surface and the lateral surfaces of the pixel driving circuit layer 120, and for example, an end of the first planarization layer 105 covering the lateral surfaces of the pixel driving circuit layer 120 may contact the buffer 102.

Therefore, the upper surface and the lateral surfaces of the pixel driving circuit layer 120 may be covered or surrounded by the first planarization layer 105. The pixel driving circuit layer 120 may be surrounded, covered, and/or sealed by the buffer 102 and the first planarization layer 105.

Moreover, the first planarization layer 105 may be surrounded, covered, and/or sealed by the hydrogen collection layer 106 and the buffer 102.

For example, as described herein, the upper surface, the lower surface, and the lateral surfaces of the first planarization layer 105 may be surrounded, covered, and/or sealed by the hydrogen collection layer 106 and the buffer 102.

In some embodiments, the hydrogen collection layer 106 includes a flat or upper portion 106U and a lateral portion 106L. The upper portion 106U and the lateral portion 106L of the hydrogen collection layer 106 are disposed on the upper surface 105U and the lateral surfaces 105L of the first planarization layer 105, respectively. In some embodiments, as illustrated in FIG. 8, the hydrogen collection layer 106 may cover the upper surface and the lateral surfaces of the first planarization layer 105, and in some embodiments, an end of the lateral portion 106L of the hydrogen collection layer 106, surrounding the lateral surfaces of the first planarization layer 105, may contact the buffer 102.

In some embodiments, the upper surface and the lateral surfaces of the first planarization layer 105 may be completely surrounded by the hydrogen collection layer 106. Therefore, the first planarization layer 105 may be surrounded, covered, and/or sealed by the buffer 102 and the hydrogen collection layer 106.

A first contact hole CH1 may be provided in the first planarization layer 105, and the hydrogen collection layer 106 may be connected to the driving transistor Tdr through the first contact hole CH1.

In some embodiments, the first contact hole CH1 extends through the second insulation layer 104. The hydrogen collection layer 106 is in contact with the second insulation layer 104 through the first contact hole CH1.

Moreover, a connection electrode 113 connected to the anode electrode AE included in the light emitting device ED may be provided in the first contact hole CH1 and a second contact hole CH2 provided in the second planarization layer 107 and may be connected to the hydrogen collection layer 106 in the first contact hole CH1.

In some embodiments, the light emitting layer EL and layer of the cathode electrode CE extends beyond the pixel 10. The light emitting layer EL and layer of the cathode electrode CE extend in the second contact hole CH2. In some embodiments, one or more of the light emitting layer EL and the layer of the cathode electrode CE extend in the first contact hole CH1. In some embodiments, a recess portion 114 is formed in the layer of the cathode electrode CE, which overlaps the second contact hole CH2.

In some embodiments, as shown in FIG. 8, for example, the second contact hole CH2 at least partially overlap the first contact hole CH1. In some embodiments, as shown in FIG. 11, the second contact hole CH2 does not overlap and offset from the first contact hole CH1. The embodiment of FIG. 11 may provide different visual effects on the performance of the display device from those of FIG. 10, e.g., in configuration scenarios that contact holes CH1 and/or CH2 are within the pixel area surrounded by the bank 108.

The hydrogen collection layer 106 may include metal for easily collecting hydrogen, and for example, may include Ti or MoTi.

In some embodiments, the anode electrode AE should be connected to the driving transistor Tdr through the connection electrode 113, and an upper end of the pixel driving circuit layer 120 including the driving transistor Tdr may be surrounded by the hydrogen collection layer 106.

Therefore, in some embodiments, the connection electrode 113 pass through the hydrogen collection layer 106 to be connected to the driving transistor Tdr.

However, in a case that a hole is formed in the hydrogen collection layer 106 so that the connection electrode 113 passes through the hole, hydrogen may flow into the pixel driving circuit layer 120 through the hole.

In some embodiments, as illustrated in FIG. 8, the hydrogen collection layer 106 may connect to the driving transistor Tdr through the first contact hole CH1, and the connection electrode 113 extending through the second contact hole CH2 may connect to the hydrogen collection layer 106 in the first contact hole CH1.

In some embodiments, because the upper surface of the pixel driving circuit layer 120 is completely covered by the hydrogen collection layer 106, hydrogen may not flow into the pixel driving circuit layer 120 through the upper surface of the pixel driving circuit layer 120.

Moreover, as described herein, because the hydrogen collection layer 106 provided on the lateral surface of the pixel driving circuit layer 120 is closely adhered to or meets an upper surface of the buffer 102 provided at a lower end of the pixel driving circuit layer 120, hydrogen may not flow into the pixel driving circuit layer 120 through the lateral surface of the pixel driving circuit layer 120.

In some embodiments, the hydrogen collection layer 106 may be provided in each of the pixels 10 included in the base substrate 101, and the hydrogen collection layers 106 included in the pixels 10 may be spaced apart from one another. That is, the hydrogen collection layer 106 may be provided in an island shape in each pixel 10.

In some embodiments, the first planarization layer 105 may be provided in each of the pixels 10 included in the base substrate 101, and the first planarization layers 105 included in the pixels 10 may be spaced apart from one another. That is, the first planarization layer 105 may be provided in an island shape in each pixel 10.

In some embodiments, the hydrogen collection layer 106 may be provided in each of the pixels 10 included in the base substrate 101, and, the hydrogen collection layer 106 provided in a pixel 10 may be provided to extend across a whole areas of the pixel 10 and may surround the pixel driving circuit layer included in the pixel 10.

For example, as illustrated in FIG. 6, the hydrogen collection layer 106 may be formed to surround only the pixel driving circuit layer 120 included in the pixel 10, and as illustrated in FIG. 7, may be formed to surround all of the pixel 10 including the pixel driving circuit layer 120.

In some embodiments, the pixel 10 may denote a region where the anode electrode AE is provided. That is, as illustrated in FIG. 8, when it is assumed that a region including the anode electrode AE is the pixel 10, the hydrogen collection layer 106 may have a range which is greater than a range of the anode electrode AE.

However, a range of the hydrogen collection layer 106 may be variously defined based on a range for defining the pixel 10.

Moreover, in FIGS. 6 to 8, a light emitting display apparatus where light emitted from a light emitting layer EL is output to the outside through the cathode electrode CE is illustrated as an example of the present disclosure. In some embodiments, the pixel driving circuit layer 120 may be disposed under the anode electrode AE.

However, in a light emitting display apparatus where light emitted from a light emitting layer EL is output to the outside through the anode electrode AE, the pixel driving circuit layer 120 may be provided not to overlap the anode electrode AE. In this case, it should be construed that the anode electrode AE is included in the pixel 10 illustrated in FIGS. 6 and 7.

Figure 9:
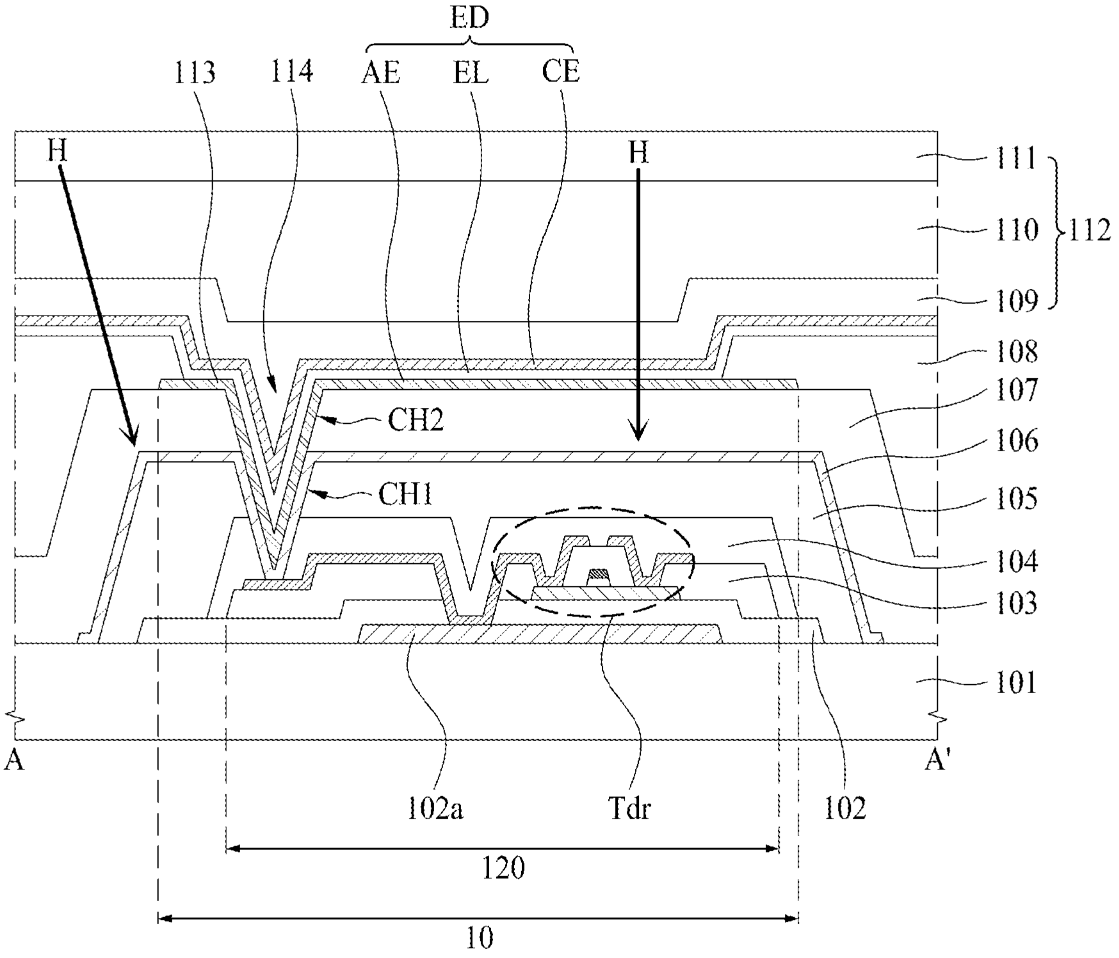
FIGS. 9, 10 and 11 are other example diagrams illustrating a cross-sectional surface taken along line A-A' and B-B' illustrated in FIGS. 6 and 7, respectively.
Figure 10:
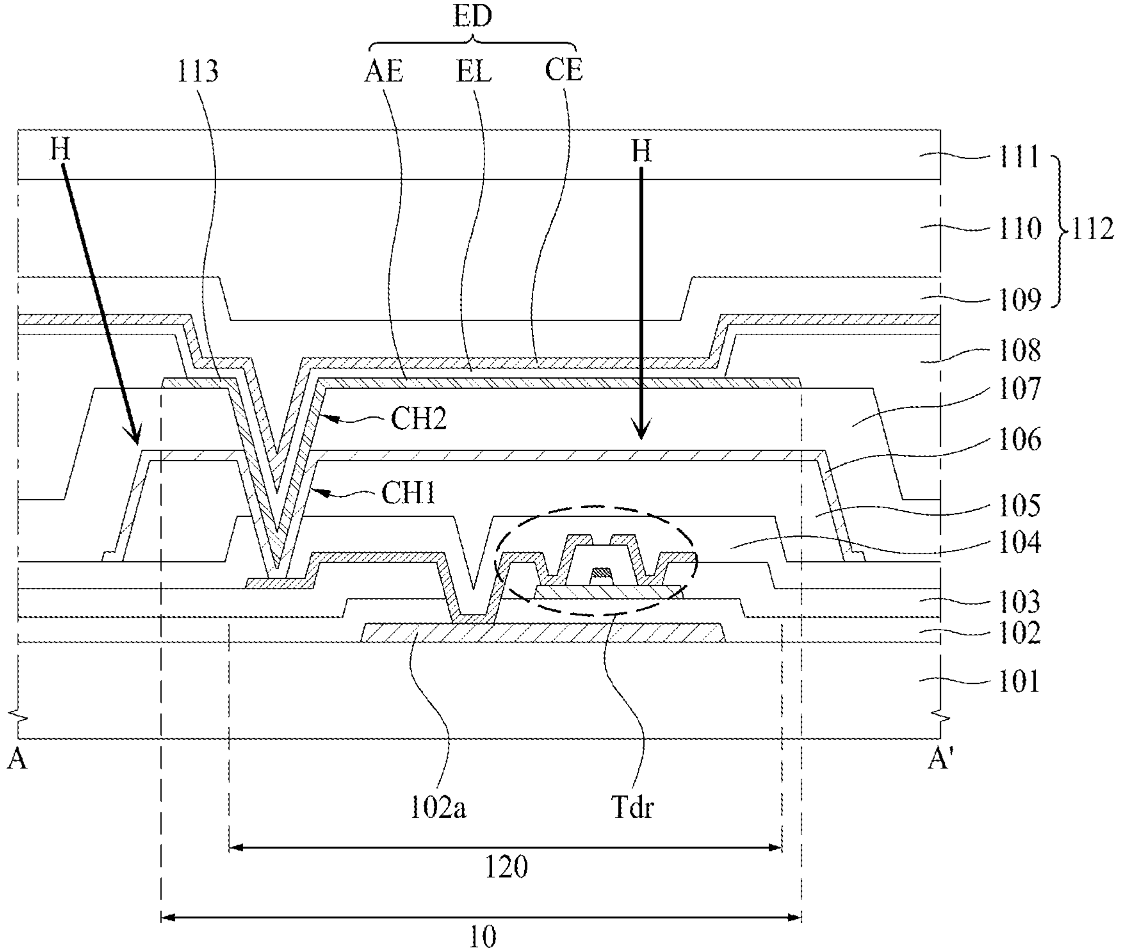
Figure 11:
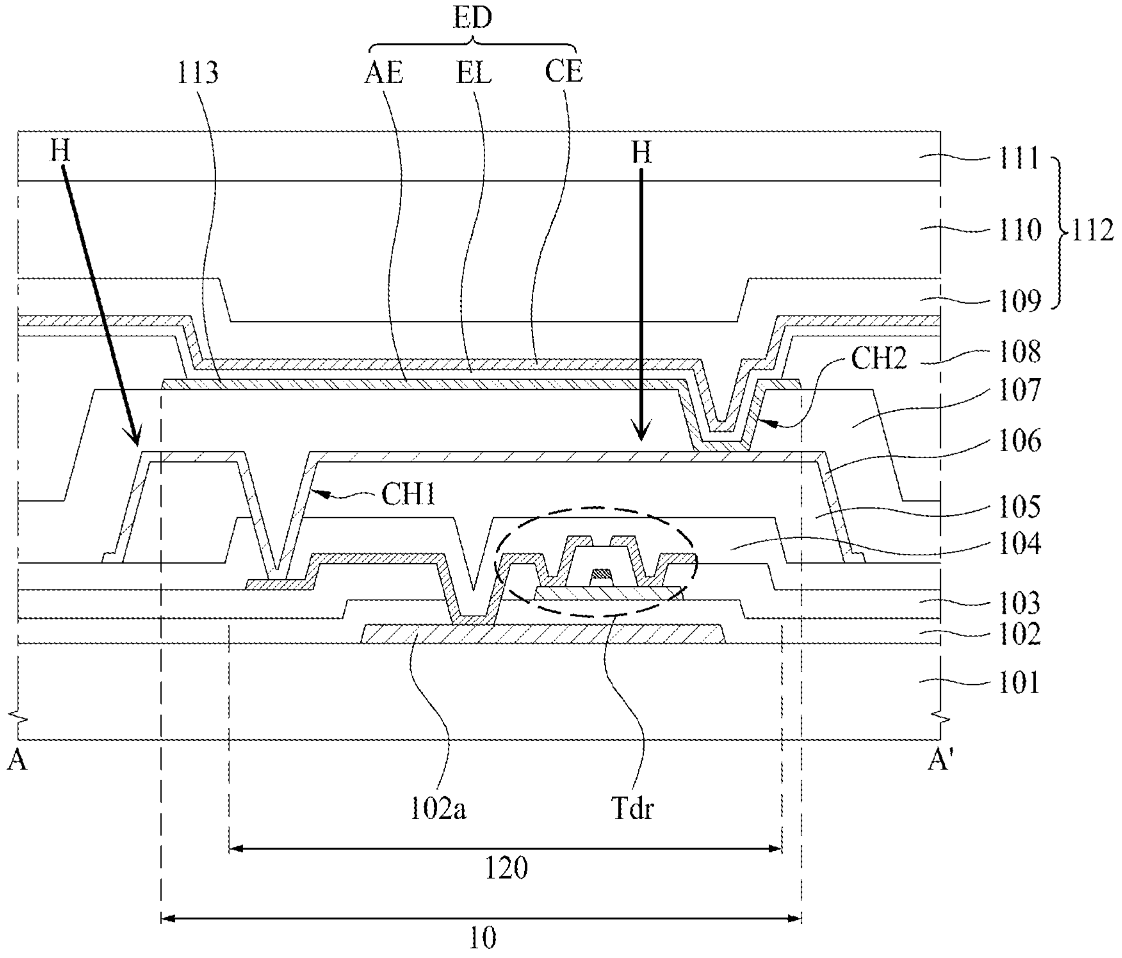

FIGS. 9 and 10 are example diagrams illustrating a cross-sectional surface taken along line A-A' or B-B' illustrated in FIGS. 6 and 7.

In an embodiment, as described with respect to FIG. 8, the first planarization layer 105 may contact the buffer 102, and the pixel driving circuit layer 120 may be, covered, surrounded, and/or sealed by the first planarization layer 105 and the buffer 102. In some embodiments, the hydrogen collection layer 106 may cover the first planarization layer 105 and may contact an upper end of the buffer 102. Accordingly, the first planarization layer 105 may be covered, surrounded, and/or sealed by the hydrogen collection layer 106 and the buffer 102.

However, in the present disclosure, as illustrated in FIG. 9, the buffer 102 may be patterned, and in some embodiments, the first planarization layer 105 may contact the base substrate 101. Therefore, the pixel driving circuit layer 120 may be sealed, covered, and/or surrounded by the first planarization layer 105 and the base substrate 101. That is, the first planarization layer 105 may cover the upper surface and the lateral surfaces of the pixel driving circuit layer 120, and particularly, an end of the first planarization layer 105 covering the lateral surfaces of the pixel driving circuit layer may contact the base substrate 101. In some embodiments, the hydrogen collection layer 106 may cover the first planarization layer 105 and may contact an upper end of the base substrate 101. Accordingly, the first planarization layer 105 may be sealed, covered, or surrounded by the hydrogen collection layer 106 and the base substrate 101. That is, the hydrogen collection layer 106 may cover the upper surface and the lateral surfaces of the first planarization layer 105, and particularly, an end of the hydrogen collection layer 106 covering the lateral surfaces of the first planarization layer 105 may contact the base substrate 101.

Moreover, in the present disclosure, as illustrated in FIG. 10, the buffer 102, the first insulation layer 103, and the second insulation layer 104 may be continuously provided in pixels, and in some embodiments, the first planarization layer 105 may be on and contact the second insulation layer 104. Therefore, the pixel driving circuit layer 120 may be covered, surrounded, and/or sealed by the first planarization layer 105 and the second insulation layer 104. In some embodiments, the hydrogen collection layer 106 may cover the first planarization layer 105 and may contact an upper end of the second insulation layer 104. Accordingly, the pixel driving circuit layer 120 may be covered, surrounded, and/or sealed by the hydrogen collection layer 106 and the second insulation layer 104. That is, the hydrogen collection layer 106 may cover the upper surface and the lateral surfaces of the first planarization layer 105, and particularly, an end of the hydrogen collection layer 106 covering the lateral surfaces of the first planarization layer 105 may contact the second insulation layer 104.

According to the present disclosure described herein, as illustrated in FIGS. 8 to 10, because hydrogen occurring in the encapsulation layer 112 (for example, the second passivation layer 111 of the encapsulation layer 112) is collected or blocked by the hydrogen collection layer 106, the hydrogen occurring in the encapsulation layer 112 may not flow into the pixel driving circuit layer 120, and thus, an error where a threshold voltage of the driving transistor Tdr is shifted by hydrogen may not occur.

Therefore, according to the present disclosure, a smear defect caused by the shift of the threshold voltage of the driving transistor Tdr may not occur, and thus, the quality of the light emitting display apparatus may be maintained for a long time.

According to the present disclosure, transistors included in a pixel driving circuit included in a pixel may be surrounded by a hydrogen collection layer. For example, the transistors may be sealed by the hydrogen collection layer and a buffer provided on a base substrate.

Therefore, hydrogen diffused from an encapsulation layer covering an upper end of a light emitting device included in a pixel may be blocked by the hydrogen collection layer and may not flow into the transistors.

Accordingly, an error where threshold voltages of transistors (for example, a threshold voltage of a driving transistor) are shifted may not occur, and thus, even when a light emitting display apparatus is used for a long time, the quality of the light emitting display apparatus may be maintained.

The above-described feature, structure, and effect of the present disclosure are included in at least one embodiment of the present disclosure, but are not limited to only one embodiment. Furthermore, the feature, structure, and effect described in at least one embodiment of the present disclosure may be implemented through combination or modification of other embodiments by those skilled in the art. Therefore, content associated with the combination and modification should be construed as being within the scope of the present disclosure.

It will be apparent to those skilled in the art that various modifications and variations can be made in the present disclosure without departing from the spirit or scope of the disclosures. Thus, it is intended that the present disclosure covers the modifications and variations of this disclosure and their equivalents.

The various embodiments described herein can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A light emitting display apparatus, comprising:

a base substrate;

a buffer provided on the base substrate;

a pixel driving circuit layer on the buffer, the pixel driving circuit layer including a driving transistor;

a first planarization layer on the pixel driving circuit layer, the first planarization layer including an upper surface and a lateral surface;

a hydrogen collection layer on the upper surface and the lateral surface of the first planarization layer;

a second planarization layer on the hydrogen collection layer;

a light emitting device provided on the second planarization layer and connected to the driving transistor; and an encapsulation layer on the light emitting device, wherein the hydrogen collection layer is included in each of a plurality of pixels and the plurality of pixels are provided in the base substrate, a plurality of first planarization layers are apart from each other and each of the plurality of first planarization layers is included in one pixel, a plurality of hydrogen collection layers are apart from each other and each of the plurality of hydrogen collection layers is included in one pixel, the hydrogen collection layer included in a pixel surrounds a pixel driving circuit layer of the pixel, and wherein the hydrogen collection layer contacts with an upper surface and a lateral surface of the first planarization layer.

2. The light emitting display apparatus of claim 1, wherein the pixel driving circuit layer is surrounded by the buffer and the first planarization layer.

3. The light emitting display apparatus of claim 1, wherein the pixel driving circuit layer is surrounded by the hydrogen collection layer and the buffer.

4. The light emitting display apparatus of claim 1, wherein the first planarization layer includes a first contact hole, and the hydrogen collection layer is connected to the driving transistor through the first contact hole.

5. The light emitting display apparatus of claim 4, comprising a connection electrode connected to an anode electrode included in the light emitting device, wherein the second planarization layer includes a second contact hole, and the connection electrode is provided in the first contact hole and the second contact hole and is connected to the hydrogen collection layer in the first contact hole.

6. The light emitting display apparatus of claim 1, comprising a plurality of pixels on the base substrate, each of the plurality of pixels including the pixel driving circuit layer, wherein each of the plurality of pixels includes the hydrogen collection layer, and a plurality of the hydrogen collection layers respectively included in the plurality of pixels are spaced apart from one another.

7. The light emitting display apparatus of claim 1, comprising a plurality of pixels on the base substrate, each of the plurality of pixels including the pixel driving circuit layer, wherein each of the plurality of pixels includes the hydrogen collection layer, and the hydrogen collection layer included in a pixel extends across a whole area of the pixel and surrounds the pixel driving circuit layer included in the pixel.

8. The light emitting display apparatus of claim 1, comprising a plurality of pixels on the base substrate, wherein the second planarization layer is continuously provided in all of the plurality of pixels on the base substrate.

9. The light emitting display apparatus of claim 1, wherein the second planarization layer is surrounded by the base substrate and the first planarization layer.

10. The light emitting display apparatus of claim 9, wherein the first planarization layer is surrounded by the hydrogen collection layer and the base substrate.

11. The light emitting display apparatus of claim 1, wherein the pixel driving circuit layer comprises an insulation layer covering the driving transistor, and the first planarization layer is surrounded by the hydrogen collection layer and the insulation layer.

12. A light emitting display apparatus, comprising:

a substrate;

a pixel driving circuit layer on the substrate, the pixel driving circuit layer including a driving transistor;

a first dielectric layer on the pixel driving circuit layer and surrounding the pixel driving layer in a lateral direction;

a conductive hydrogen collection layer on the first dielectric layer and surrounding the dielectric layer in the lateral direction;

a first planarization layer on the conductive hydrogen collection layer; and a light emitting element on the first planarization layer, wherein the hydrogen collection layer is included in each of a plurality of pixels and the plurality of pixels are provided in the substrate, a plurality of first planarization layers are apart from each other and each of the plurality of first planarization layers is included in one pixel, a plurality of hydrogen collection layers are apart from each other and each of the plurality of hydrogen collection layers is included in one pixel, the hydrogen collection layer included in a pixel surrounds a pixel driving circuit layer of the pixel, and wherein the hydrogen collection layer contacts with an upper surface and a lateral surface of the first planarization layer.

13. The light emitting display apparatus of claim 12, wherein the first dielectric layer includes a first contact hole, wherein the conductive hydrogen collection layer extends in the first contact hole and in contact with a terminal of the driving transistor through the first contact hole.

14. The light emitting display apparatus of claim 12, wherein the first planarization layer includes a second contact hole, and a terminal of the light emitting element is connected to the conductive hydrogen collection layer through the second contact hole.

15. The light emitting display apparatus of claim 12, wherein the light emitting element include a recess portion that overlaps the second contact hole.

16. The light emitting display apparatus of claim 12, comprising a buffer vertically between the first dielectric layer and the substrate, wherein the conductive hydrogen collection layer meets the buffer vertically between the first dielectric layer and the substrate.

17. The light emitting display apparatus of claim 12, comprising a second dielectric layer on the first dielectric layer, the second dielectric layer including an upper surface and a lateral surface, wherein the conductive hydrogen collection layer includes an upper portion and a lateral portion, the upper portion on the upper surface of the second dielectric layer, and the lateral portion on the lateral surface of the second dielectric layer.

18. A light emitting display apparatus, comprising:

a substrate;

a pixel driving circuit layer on the substrate, the pixel driving circuit layer including a driving transistor;

a first dielectric layer on the pixel driving circuit layer, the first dielectric layer including a contact hole that reaches a terminal of the driving transistor;

a conductive hydrogen collection layer on the first dielectric layer, the conductive hydrogen collection layer extending in the contact hole and in contact with the terminal of the driving transistor through the contact hole;

a first planarization layer on the conductive hydrogen collection layer; and a light emitting element on the first planarization layer, wherein the hydrogen collection layer is included in each of a plurality of pixels and the plurality of pixels are provided in the substrate, a plurality of first planarization layers are apart from each other and each of the plurality of the first planarization layers is included in one pixel, a plurality of hydrogen collection layers are apart from each other and each of the plurality of hydrogen collection layers is included in one pixel, the hydrogen collection layer included in a pixel surrounds a pixel driving circuit layer of the pixel, and wherein the hydrogen collection layer contacts with an upper surface and a lateral surface of the first planarization layer.

19. The light emitting display apparatus of claim 18, wherein the conductive hydrogen collection layer including an upper portion and a lateral portion that extends from the upper portion, the lateral portion surrounding the pixel driving circuit layer from a lateral direction.

20. The light emitting display apparatus of claim 18, wherein the conductive hydrogen collection layer is in the form of an island shape.

* * * * *